(12) United States Patent
Griffin et al.

(10) Patent No.: US 10,938,366 B2
(45) Date of Patent: Mar. 2, 2021

(54) VOLUME LEVEL METER

(71) Applicants: Joseph N Griffin, Jasper, AL (US);
Corey D Chapman, Jasper, AL (US)

(72) Inventors: Joseph N Griffin, Jasper, AL (US);
Corey D Chapman, Jasper, AL (US)

( * ) Notice: Subject to any disclaimer, the term of this patent is extended or adjusted under 35 U.S.C. 154(b) by 0 days.

(21) Appl. No.: 16/403,228

(22) Filed: May 3, 2019

(65) Prior Publication Data

US 2020/0350882 A1 Nov. 5, 2020

(51) Int. Cl.
*H03G 3/32* (2006.01)
*H03G 3/00* (2006.01)
*H04R 1/08* (2006.01)
*H04R 1/34* (2006.01)

(52) U.S. Cl.
CPC .............. *H03G 3/32* (2013.01); *H03G 3/001* (2013.01); *H04R 1/086* (2013.01); *H04R 1/08* (2013.01); *H04R 1/342* (2013.01)

(58) Field of Classification Search
None
See application file for complete search history.

(56) References Cited

U.S. PATENT DOCUMENTS

| | | |
|---|---|---|
| 1,901,065 A | 3/1931 | Spotts |
| 3,991,628 A | 11/1976 | Narita |
| 4,061,042 A | 12/1977 | Hetrich |
| 4,102,208 A | 7/1978 | Betz |
| 4,570,746 A | 2/1986 | Das et al. |
| 4,600,077 A | 7/1986 | Drever |
| 4,679,042 A | 7/1987 | Trethewey |
| 5,751,819 A | 5/1998 | Dorrough |
| 6,879,864 B1 | 4/2005 | Cleary, Jr. |
| 8,369,556 B2 | 2/2013 | Power |
| 9,118,989 B2 | 8/2015 | Zukowski |
| 2002/0069050 A1* | 6/2002 | Funaki ................. G10H 1/0008 704/207 |
| 2002/0186849 A1 | 12/2002 | Duffy |
| 2003/0039372 A1* | 2/2003 | Tsutsumi ................ H04S 1/007 381/107 |
| 2005/0231873 A1* | 10/2005 | Nell ........................ H04R 3/00 361/92 |
| 2005/0271233 A1 | 12/2005 | Uchimura |
| 2007/0017292 A1* | 1/2007 | Sper ......................... G01H 3/10 73/646 |
| 2009/0052713 A1* | 2/2009 | Abe ....................... H04R 1/083 381/355 |
| 2012/0020511 A1* | 1/2012 | Power .................... H04R 1/086 381/352 |
| 2018/0143522 A1* | 5/2018 | Harooni ............... H04N 9/3141 |

* cited by examiner

*Primary Examiner* — Antim G Shah
(74) *Attorney, Agent, or Firm* — Nicholas J. Landau; Ryan J. Letson; Bradley Arant Boult Cummings LLP

(57) ABSTRACT

A volume level meter has a housing that is mounted on a microphone, and is connected to a pop filter positioned in front of a vocalist and adjacent to a microphone. The display faces the vocalist, and is arranged on the housing so that it indicates a volume level of audio signals received from the microphone. The vocalist can see indicators on the display and know the volume level of the audio signal from the microphone. This allows the vocalist to monitor the volume level indicators of the volume level display and control their vocal volume levels based on the indicators. In this way, the vocalist to reduce fluctuations in vocal volume levels that may lead to distortion of the audio signal by monitoring the volume level display.

15 Claims, 11 Drawing Sheets

VOLUME LEVEL METER

BACKGROUND

Field

The present disclosure relates generally to vocal volume unit meter systems to provide a visible volume level indicator to a vocalist.

BACKGROUND

The human voice is capable of producing sounds across a wide range of volume levels. While this is sometimes desirable, such as in the context of use in which changes in volume levels can provide a dramatic effect, fluctuations in volume levels in some instances may result in distortion of the sound when heard by a listener.

Significant fluctuations in volume levels often occur during live use. Artists, radio show hosts, and other vocalists broadcast live or record vocals using microphones, which receive acoustic vibrations and convert them into electrical audio signals. Vocalists often have no way to monitor vocal levels while recording. As a result, the vocalist inputs a sound level that is not constant, and fluctuates across various volume levels. Distortion of the audio signal can result.

Electronic devices and software plug-ins can have features meant reduce distortion by compensating for volume level fluctuations, such as by normalizing the volume levels of the audio signal. However, distortion still usually results. In addition, although audio signals can be sent from a microphone to an engineer or technician for processing after recording, such as to modify or reduce the dynamic range of the audio signal by modifying peaks and troughs of an audio signal, it can be difficult to reduce or eliminate distortion sufficiently, especially during a live broadcast. Improved techniques for reducing vocal volume level fluctuations are generally desired.

SUMMARY

The present disclosure describes a vocal volume level meter, components thereof, and methods of using the same, which addresses the problems described above by receiving signals from a microphone that have a volume level and displaying an indicator of the volume level on a volume level display, such as mounted on a pop filter. It is to be understood that not every embodiment of the invention described herein will address every problem detailed in the background section.

In a first aspect, a volume level meter for a microphone is provided. The volume level meter comprises: means for receiving audio signals from the microphone, said signals having a volume level; and means for visually displaying the volume level within the field of view of a vocalist.

In a second aspect, a volume level meter for a microphone is provided. The meter comprises: a housing mounted on the microphone; a connection to receive signals from the microphone, said signals having a volume level; a volume level display arranged on the housing so as to indicate the volume level; and an amplifier to amplify the signals to an amperage sufficient to drive the volume level display.

In a third aspect, a sound recording system is provided. The system comprises: a microphone; a volume level display positioned adjacent to the microphone and configured to provide an indicator visible to a vocalist of a sound volume level received by the microphone; and a display controller coupled to the microphone and the volume level display, wherein the display controller is configured to receive an amplified audio signal from the microphone that is indicative of the sound volume level; and wherein the display controller is configured to control the volume level display to indicate the sound volume level.

The above presents a simplified summary in order to provide a basic understanding of some aspects of the claimed subject matter. This summary is not an extensive overview. It is not intended to identify key or critical elements or to delineate the scope of the claimed subject matter. Its sole purpose is to present some concepts in a simplified form as a prelude to the more detailed description that is presented later.

DETAILED DESCRIPTION

A. Definitions

Figure 1:
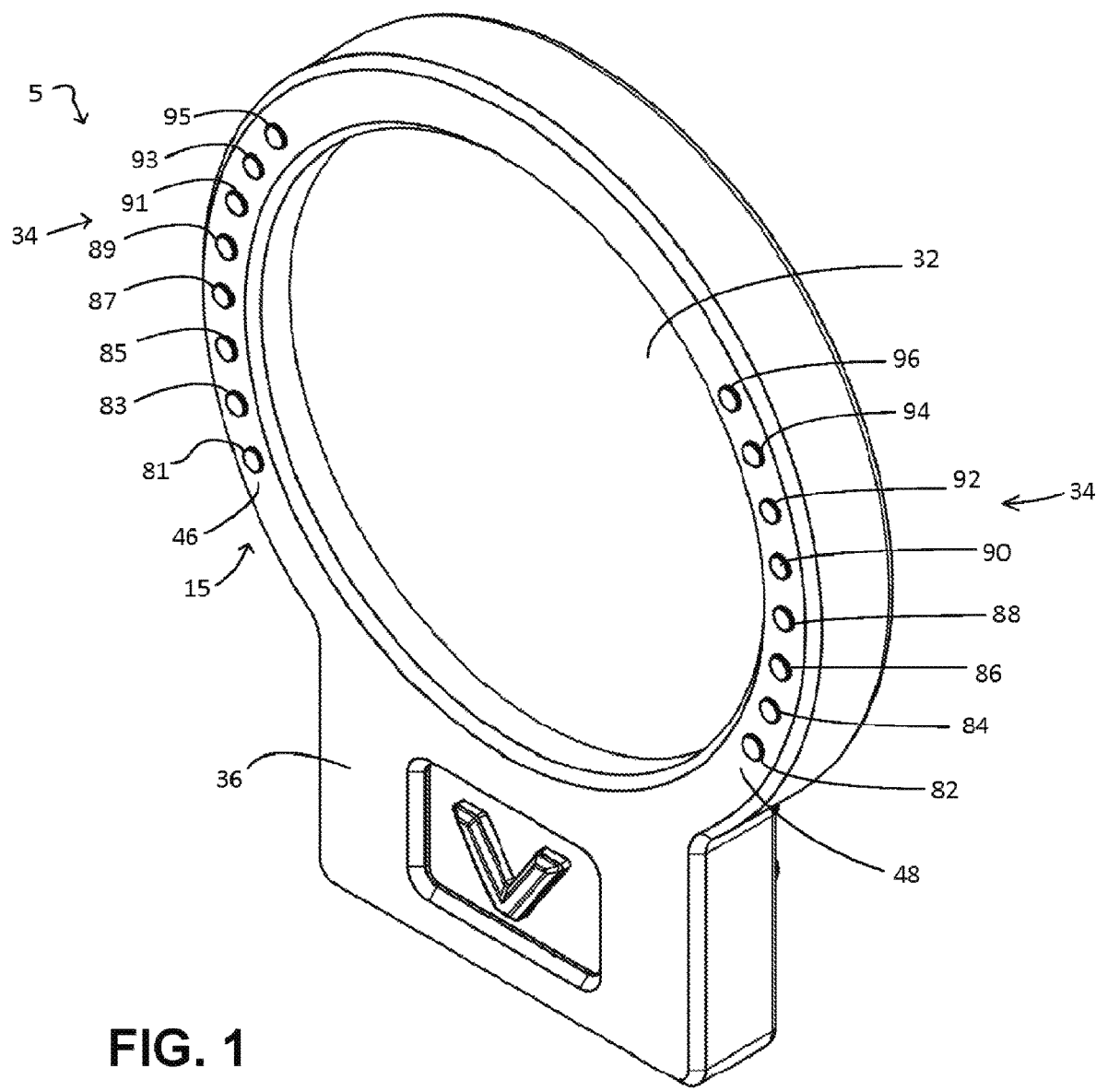
FIG. 1. A three-dimensional perspective view of an embodiment of a volume level meter.
Figure 2:
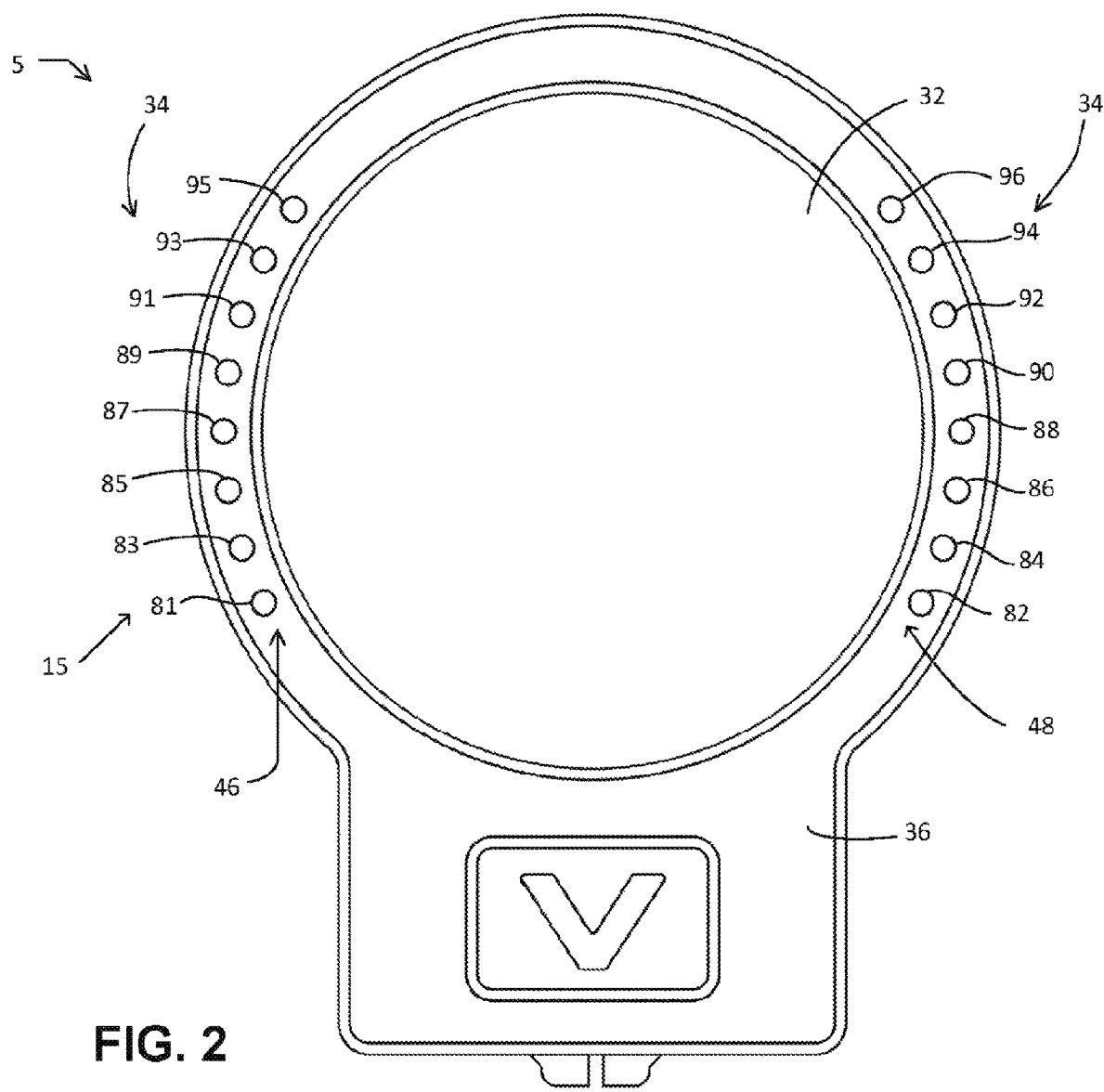
FIG. 2. A front view of the embodiment of the volume level meter shown in FIG. 1.
Figure 3:
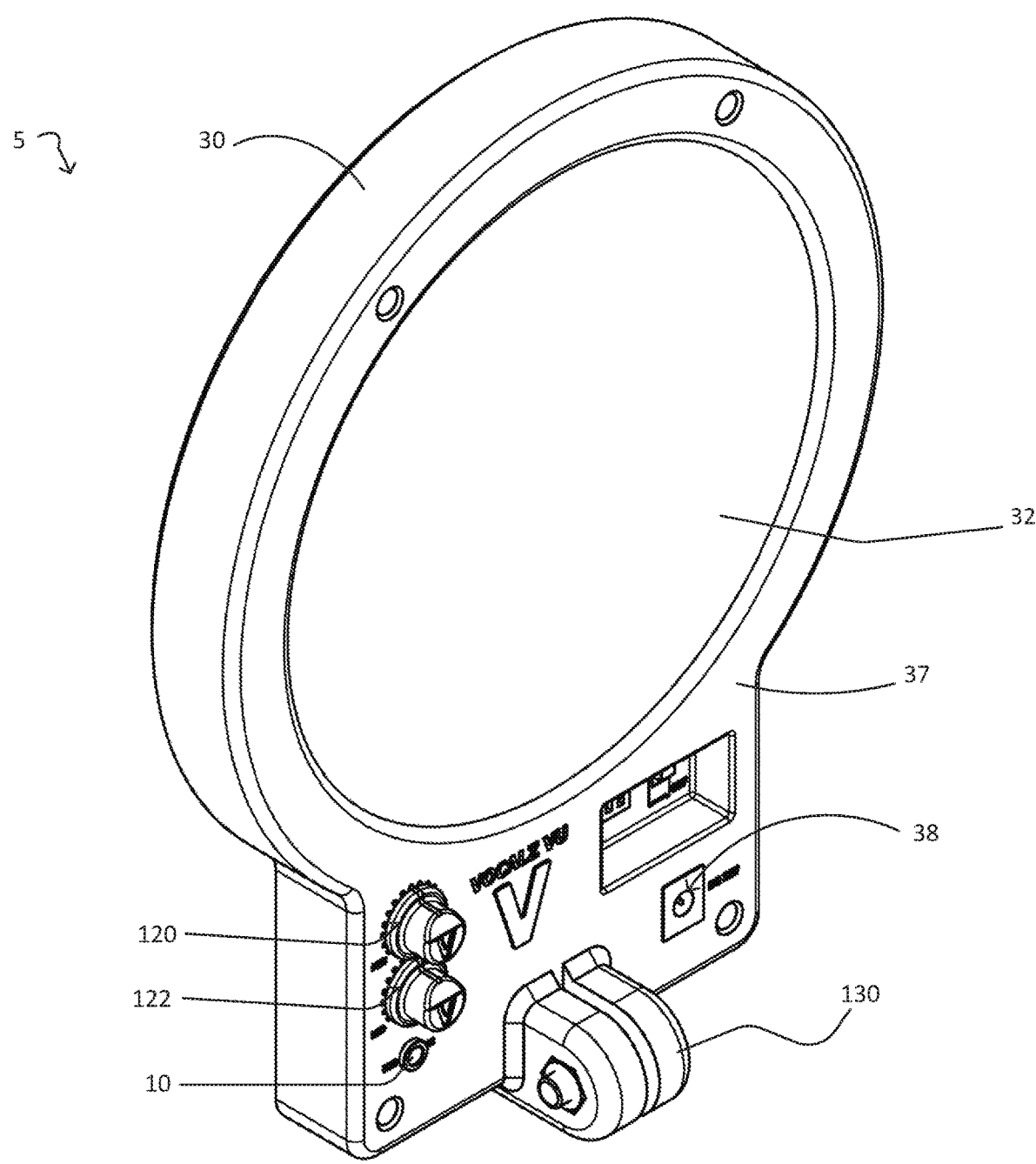
FIG. 3. A rear three-dimensional perspective view of the embodiment of the volume level meter shown in FIG. 1.
Figure 4:
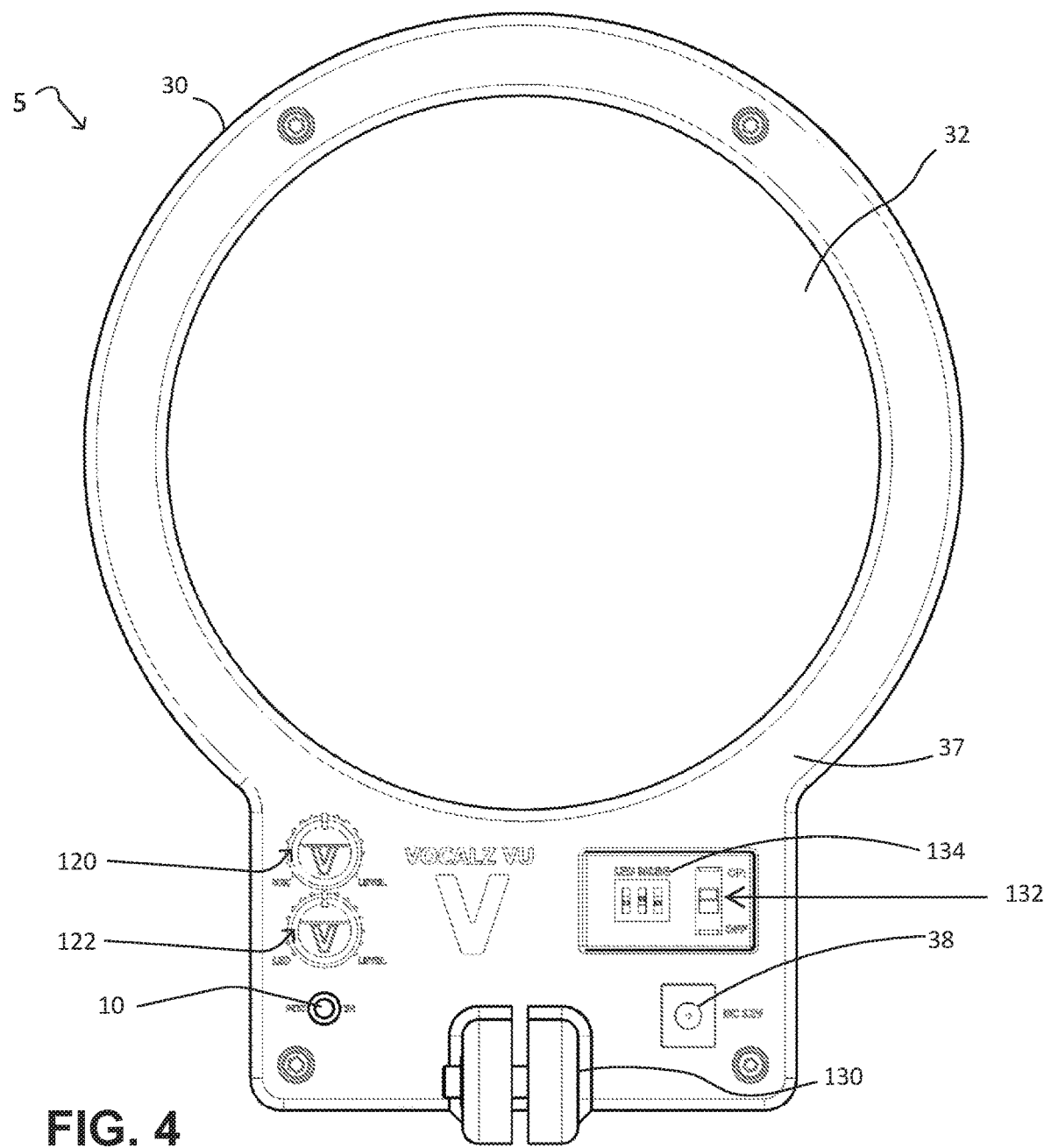
FIG. 4. A rear view of the embodiment of the volume level meter shown in FIG. 1.
Figure 5:
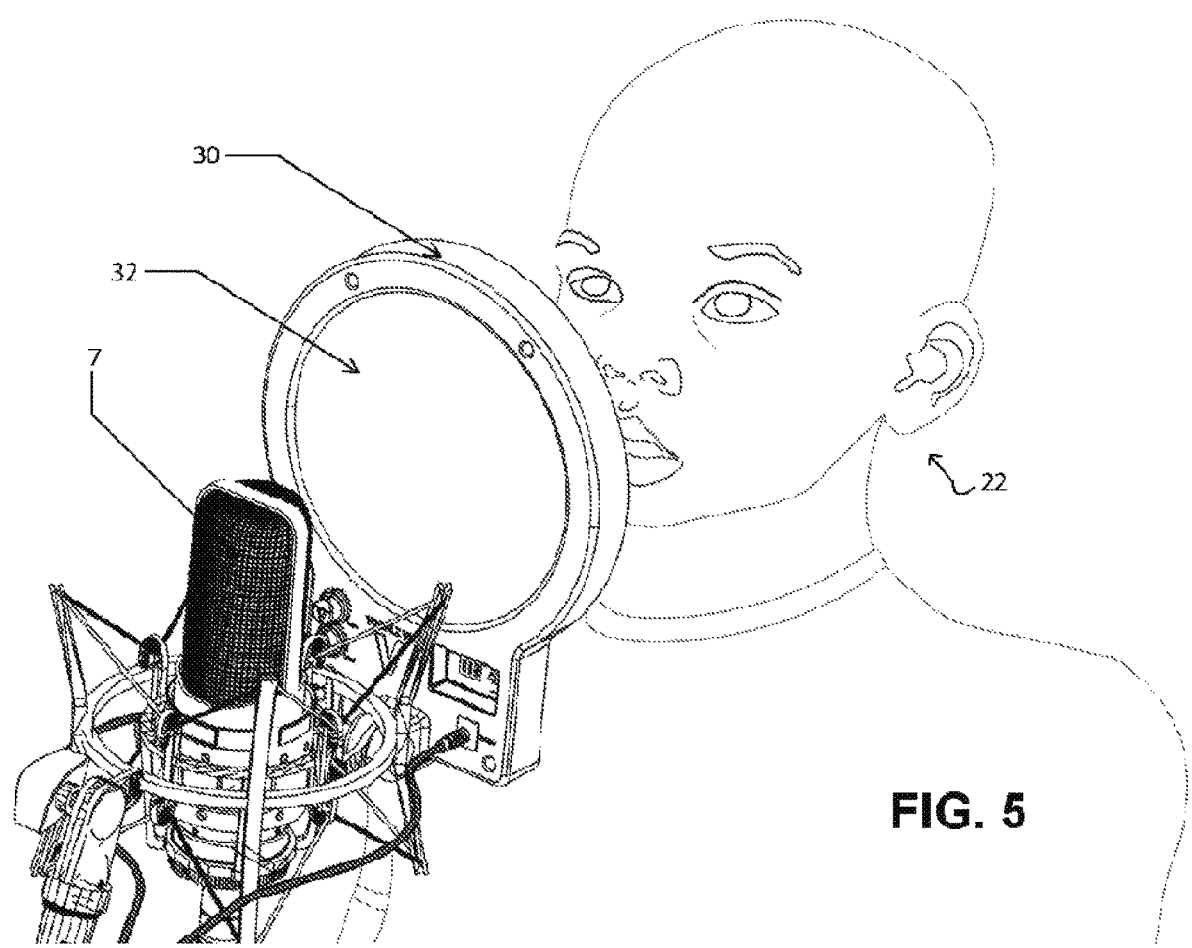
FIG. 5. A rear three-dimensional perspective view of the embodiment of the volume level meter shown in FIG. 1 mounted on a microphone.
Figure 6:
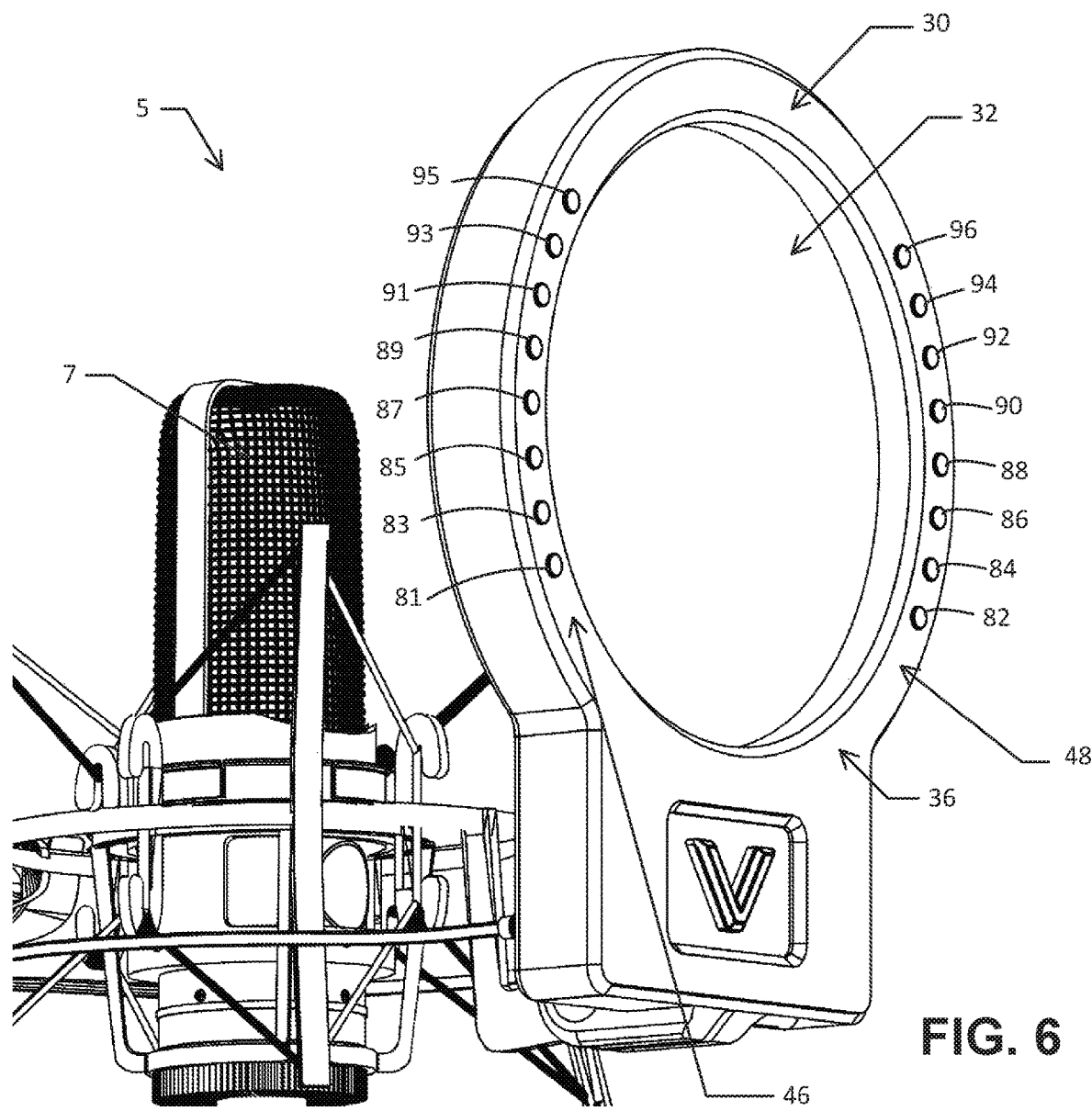
FIG. 6. A front three-dimensional perspective view of the embodiment of the volume level meter shown in FIG. 1 mounted on a microphone.
Figure 7:
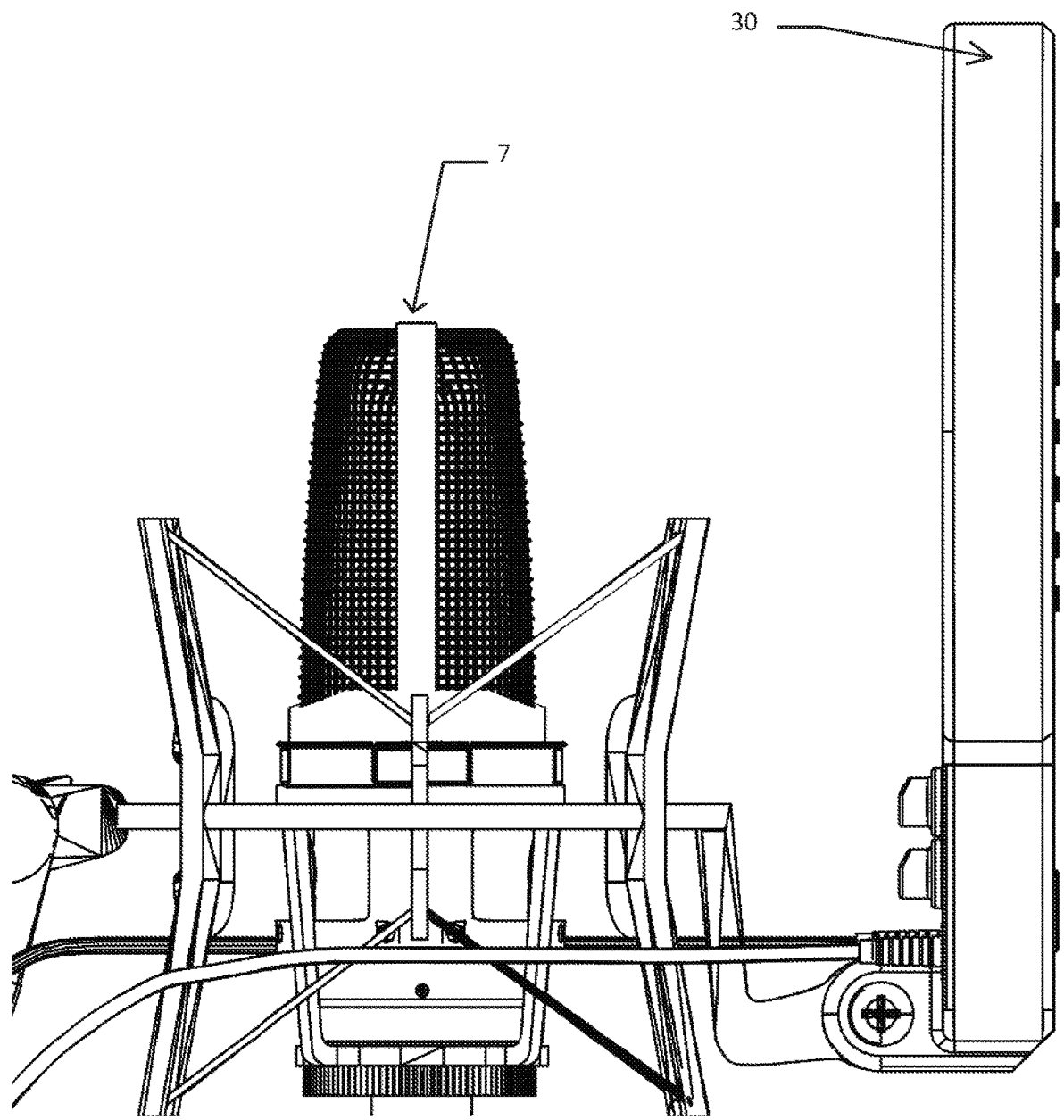
FIG. 7. A side view of the embodiment of the volume level meter shown in FIG. 1 mounted on a microphone.
Figure 8:
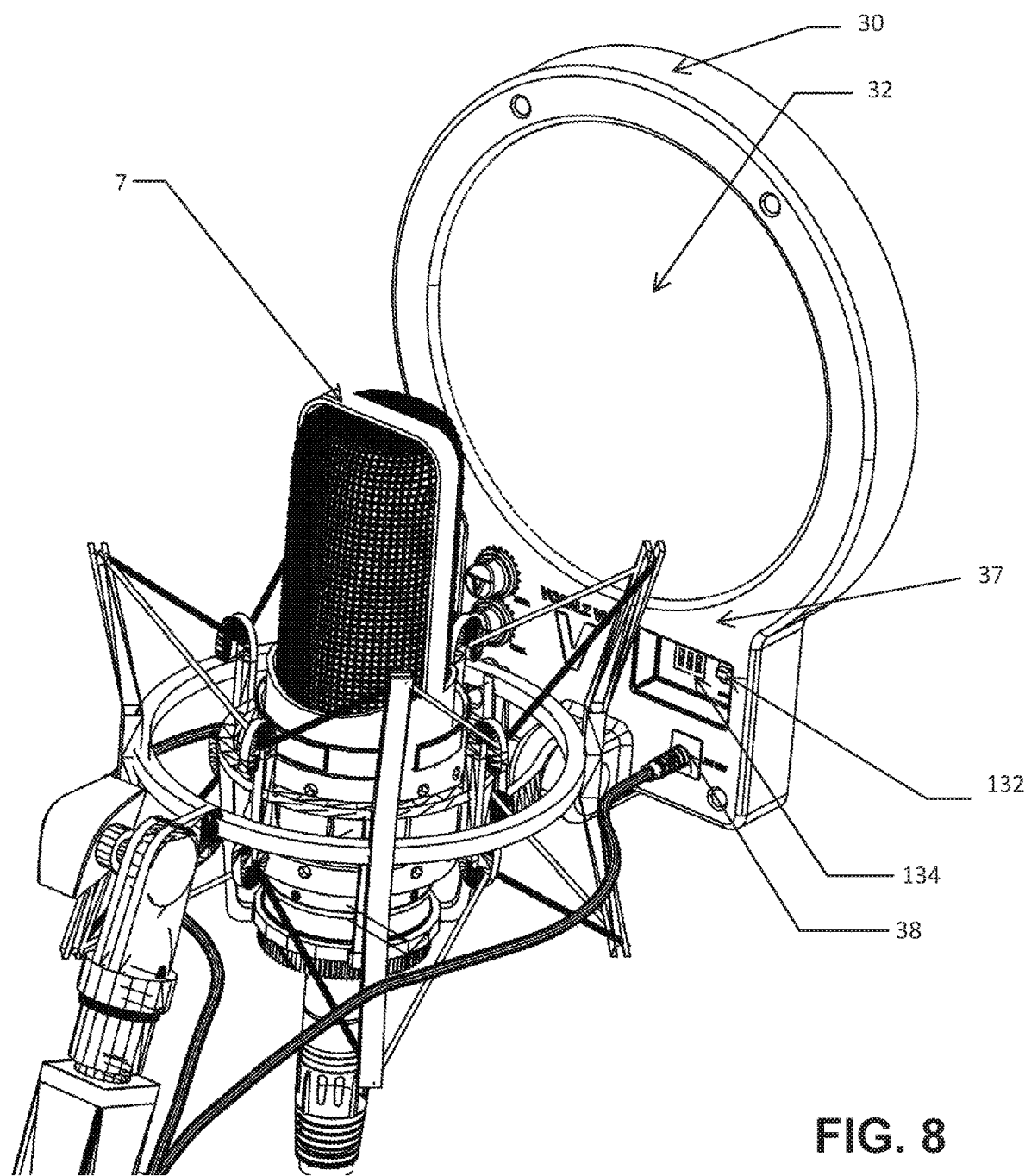
FIG. 8. Detail of a rear perspective view of the embodiment of the volume level meter shown in FIG. 1 mounted on a microphone.
Figure 9:
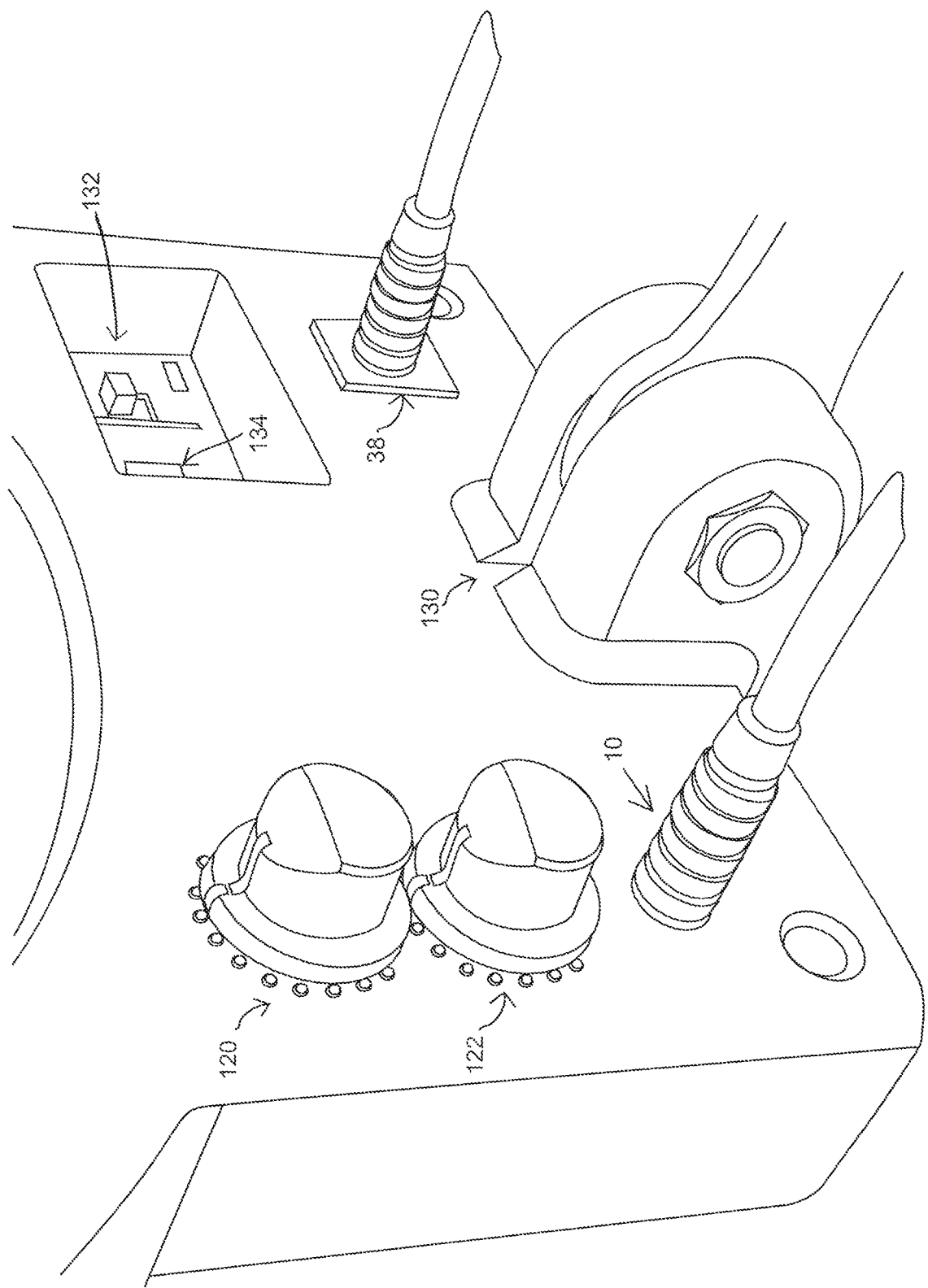
FIG. 9. Additional detail of a rear perspective view of the embodiment of the volume level meter shown in FIG. 1.
Figure 10:
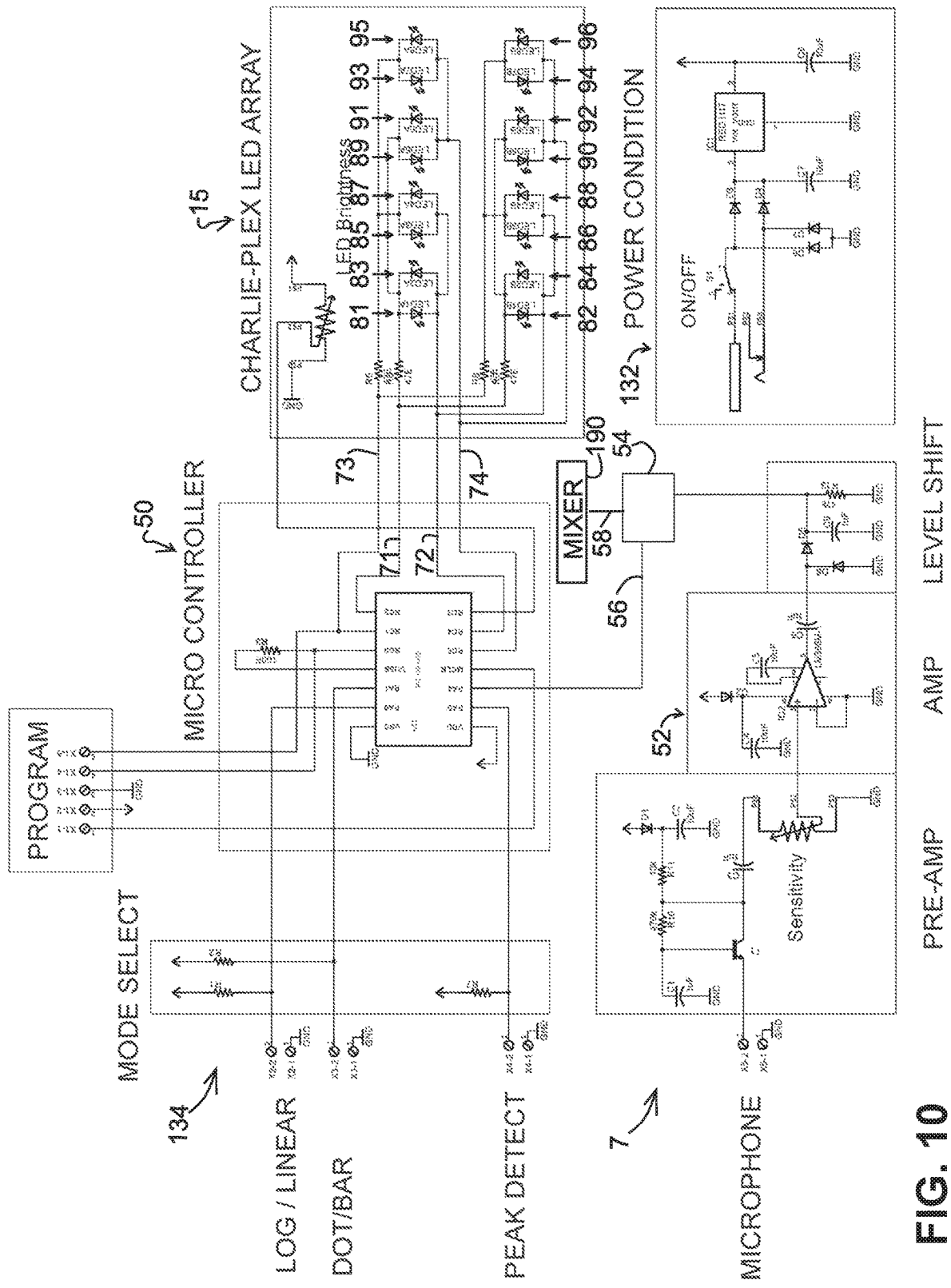
FIG. 10. A circuit diagram of the embodiment of the volume level meter shown in FIG. 1.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well known functions or constructions may not be described in detail for brevity or clarity.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments.

The terminology used herein is for the purpose of describing particular embodiments only and is not intended to be limiting. As used herein, the singular forms "a", "an" and "the" are intended to include the plural forms as well, unless the context clearly indicates otherwise.

Spatially relative terms, such as "under", "below", "lower", "over", "upper" and the like, may be used herein for ease of description to describe one element or feature's relationship to another when the apparatus is right side up.

The terms "first", "second", and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure.

Terms such as "at least one of A and B" should be understood to mean "only A, only B, or both A and B." The same construction should be applied to longer list (e.g., "at least one of A, B, and C").

The term "consisting essentially of" means that, in addition to the recited elements, what is claimed may also contain other elements (steps, structures, ingredients, components, etc.) that do not adversely affect the operability of what is claimed for its intended purpose as stated in this disclosure. This term excludes such other elements that adversely affect the operability of what is claimed for its intended purpose as stated in this disclosure, even if such other elements might enhance the operability of what is claimed for some other purpose.

B. Systems and Methods of Metering Vocal Volume Levels for a Microphone

Systems and methods of using a volume level meter 5 for metering vocal volume levels for a microphone 7 with a volume level display 15 are provided. A microphone 7 is utilized to receive sound vibrations and convert them to audio signals that have a volume level (e.g., sound amplitude). The volume level meter 5 may be mounted on a shock mount of the microphone 7 via an interface on housing 30, which is connected to a pop filter 32 and positioned in front of a vocalist 22 and adjacent to the microphone 7. The display 15 may face the vocalist 22, and be arranged on the housing 30 so that it indicates a volume level of audio signals received from the microphone 7. The vocalist 22 can see indicators 34 of the display 15, such as a plurality of lights 34 that indicate the volume level of an audio signal from the microphone 7. As a result, the vocalist 22 can monitor the volume level indicators 34 of the volume level display 15 and control their vocal volume levels based on the indicators 34. The volume level meter 5 can allow the vocalist 22 to reduce fluctuations in vocal volume levels that may lead to distortion of the audio signal.

The embodiment of the volume level meter 5 shown in the figures has a housing 30 that has a pop filter 32 connected to it, but the volume level meter 5 is not limited to this embodiment. For example, the housing 30 may be an encasement for the microphone 7 or other housing that is capable of being configured to positioned a volume level display 15, as described below, within the field of view of the vocalist 22.

The housing 30 depicted in the figures is configured to allow for use with traditional pop filter implementations, and can have characteristics making it compatible with such uses such as thickness, interfaces and mounting hardware, or other features. In the embodiment of the figures, the housing 30 is a circular frame for a pop filter 32, although other types of housings may be possible in other embodiments. The pop filter 32 depicted by the figures is configured to protect the microphone 7 from noise while the vocalist 22 is using the microphone 7, such as by fast-moving air from the vocalists' 22 mouth. In other embodiments, the pop filter 32 can have different shapes besides a circular shape, and can be one or more pop filters 32 connected to the housing 30. In addition, the housing 30 can be coupled to the microphone 7 via a mount 130, which can be various types of hardware for coupling the housing of the volume level meter 5 to the microphone 7 (e.g., a shock mount, microphone stand, etc.).

The volume level meter 5 can have a first side 36 that faces the vocalist 22 and a second side 37 that is opposite to the first side 36 and faces away from the vocalist 22 (e.g., toward the microphone 7). The volume level display 15 may be arranged on the first side 36 so that the indicators 34 are visible to the vocalist 22. The housing 30 can have additional features that indicate various aspects of the audio signal from the microphone (such as pitch, tone, etc.) and provide indicators to the vocalist 22, any of which may be positioned on the housing 30.

In the embodiment shown by the figures, volume level meter 5 has a connection 10 that is configured to receive an amplified audio signal from the microphone 7. The amplified audio signal from the microphone 7 is indicative of the volume level of a sound volume level captured by the microphone 7. The audio signals may be converted from acoustic vibrations based on the vocalist's voice, amplified (e.g., modulated) by amplifier 52, and provided to the connection 10, which provides the amplified audio signals to controller 50 of vocal level meter 5. In some embodiments, the amplified audio signal can be provided to connection 10 via a wired or wireless connection. In this regard, the connection 10 in the embodiment of the figures is shown as a 3.5 millimeter (mm) wired connection, but other communications are possible are possible via connection 10, including alternative wired connection configurations and wireless transmission protocols (e.g., Radio Frequency (RF), Infrared Radiation (IR), Bluetooth, Near-Field Communication (NFC), etc.).

The volume level meter 5 also can have a splitter 54 that is coupled to the microphone 7 and configured to split the audio signal into two or more split amplified audio signals. As depicted in the figures, the splitter 54 can provide a first split amplified audio signal via path 56 to the display controller 50 and a second split amplified audio signal 58 can be provided to mixer 190. In this regard, the same audio signal amplified by the microphone 7 can be provided both to the volume level meter 5 and processed by controller 50 and to mixer 190 where an engineer can perform processing of the signal.

The volume level meter 5 can be powered using power provided to the microphone 7 (e.g., phantom power). In order to power the resources of the volume level meter 5, the volume level meter 5 in the embodiment of the drawings is configured to modulate the signal from the initial amperage used to power the microphone 7 to an amperage that is sufficient to drive the volume level display 15. For example, the lights 81-96 in the example embodiment of the drawings are configured to operate on an approximately 7-volt power supply, although the microphone 7 is configured to output approximately 7 milliamps of current. The volume level meter 5 has a power conditioning circuit that can use various types of hardware, including a power conditioning circuit, to condition power received from the microphone 7.

Power interface 38 of the volume level meter 5 can be configured to receive power that can drive the resources of the volume level meter 5. In some embodiments, the resources of the volume level meter 5 can be operated using direct current (DC) phantom power transmitted from the microphone 7. As an example, the volume level display 15 and controller 50 of the volume level meter 5 illustrated by the figures can be powered using phantom power from the power interface 38. In some embodiments, the power interface 38 and connection 10 may be the same interface.

Figure 11:
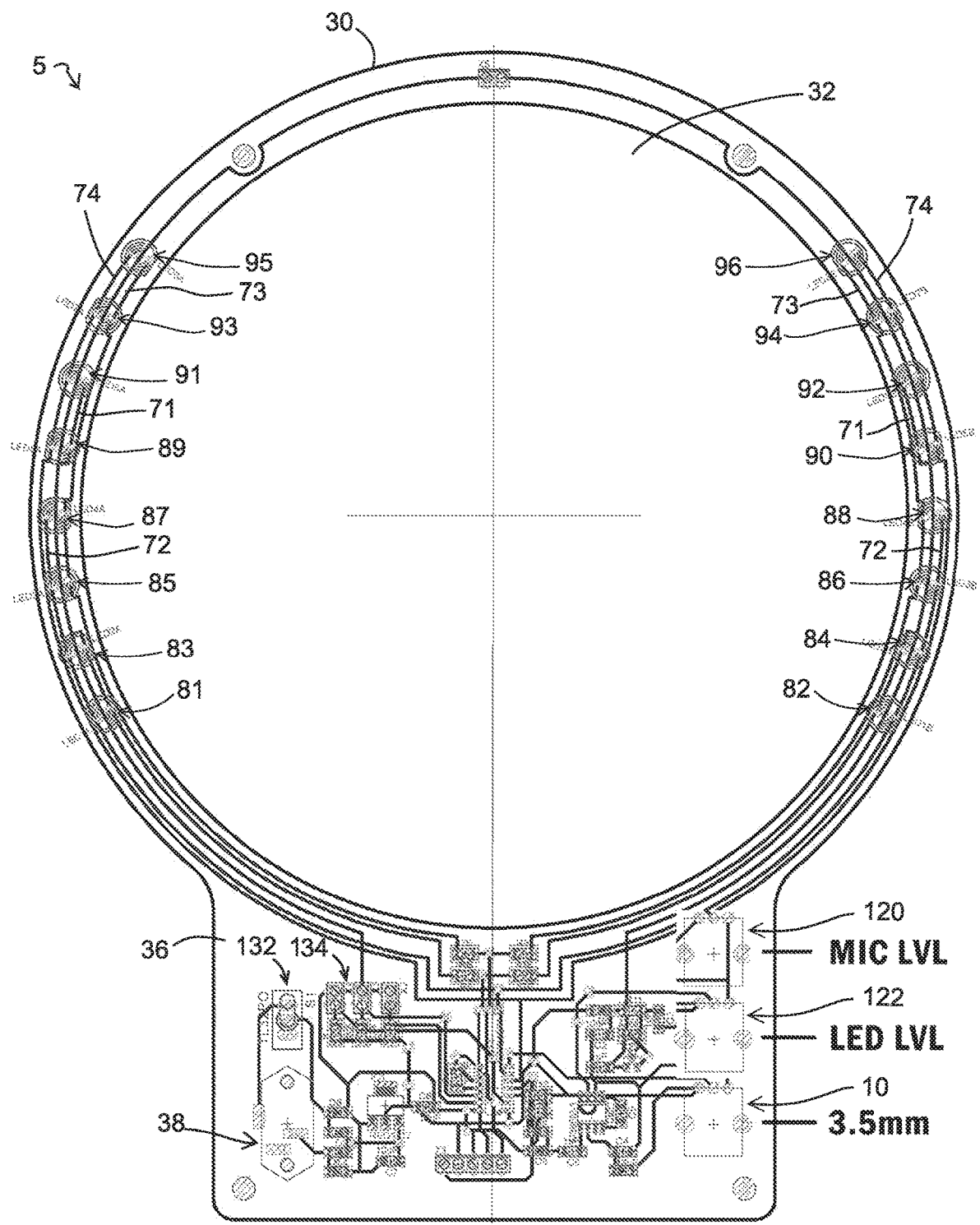
FIG. 11. A wiring diagram of the embodiment of the volume level meter shown in FIG. 1.

The volume level meter 5 may have a gain control interface 120 coupled to the controller 50 and configured to allow a vocalist 22 or other user to adjust sensitivity of the volume level meter 5 to a sensitivity that is similar to that of the sound board coupled to the microphone 7. The gain control interface 120 can include a knob coupled to control circuitry (FIG. 11), such as a potentiometer or other similar components, and may be configured to allow a user (e.g., vocalist 22) to control sensitivity of the volume level meter 5 to audio signals from the microphone 7.

The volume level meter 5 may have a brightness control interface 122, which can include a knob coupled to control circuitry (FIG. 11), such as a potentiometer or other similar components, and may be configured allow a user (e.g., vocalist 22) to adjust sensitivity or brightness of the volume level display 15 as desired. A power on/off switch 132 is configured to toggle power to the volume level meter 5 on or off, and can include various types of hardware to implement a switch of the volume level meter 5. In addition, the volume level meter 5 can have an indicator mode interface 134 having a plurality of switches and configured to allow a vocalist 22 or other user to toggle between various indicator modes of the volume level display 15. For example, in embodiments in which the volume level display is configured to display indicators as either solid or flashing LED lights (e.g., lights 81-96), the vocalist 22 or other user can adjust the indicators as desired using the indicator mode interface 134.

When the volume level meter 5 receives audio signals from the microphone 7, it may process the signals using controller 50 (e.g., a microprocessor) disposed within the housing 30, and determine a volume level associated with the audio signals. The controller 50 can include various types of hardware, software or combinations thereof to achieve the functionality described herein. In some embodiments, the controller 50 can be coupled to memory of volume level meter 5, which can includes a main memory, such as a random access memory (RAM) or other dynamic storage device, coupled to the bus for storing information and instructions to be executed by the processor. Main memory also may be used for storing temporary variable or other intermediate information during execution of instructions to be executed by the processor. The controller 50 further can be in communication with a read only memory (ROM) or other static storage device coupled to the bus for storing static information and instructions for the processor. A storage device, such as a magnetic disk or optical disk, is provided and coupled to the bus for storing information and instructions, such as control instructions that can include instructions that, when executed by the controller 50, cause the controller 50 to perform operations comprising at least the functionality ascribed herein to the controller 50.

The term "computer-readable medium" as used herein refers to any medium that participates in providing instructions to the processor for execution. Such a medium may take many forms, including, but not limited to, non-volatile media, volatile media, and transmission media. Non-volatile media include, for example, optical or magnetic disks, such as the storage device. Volatile media include dynamic memory, such as the main memory. Transmission media include coaxial cables, copper wire, and fiber optics, including the wires that comprise the bus. Common forms of computer-readable media include, for example, flash memory, hard disk, magnetic tape, any other magnetic medium, a CD-ROM, DVD, any other optical medium, floppy disk, a flexible disk, punch cards, paper tape, any other physical medium with patterns of holes, a RAM, a PROM, an EPROM, a FLASHEPROM, any other memory chip or cartridge, or any other medium from which a computer can read.

Various forms of computer-readable media may be involved in carrying one or more sequences of one or more instructions to the processor for execution. For example, the instructions may initially be borne on a magnetic disk of a remote computer. The remote computer can load the instructions into its dynamic memory and send the instructions over a telephone line using a modem. In an embodiment, a modem local to the volume level meter 5 can receive the data on the telephone line and use an infrared transmitter to convert the data to an infrared signal. An infrared detector coupled to the bus can receive the data carried in the infrared signal and place the data on the bus. The bus carries the data to the main memory, from which the processor retrieves and executes the instructions. The instructions received by the main memory may optionally be stored on the storage device either before or after execution by the processor. The controller 50 also can include a communication interface coupled to the bus. The communication interface provides a two-way data communication coupling to a network link that is connected to a local network. For example, the communication interface may be an integrated services digital network (ISDN) card or a modem to provide a data communication connection to a corresponding type of telephone line. As another example, the communication interface may be a local area network (LAN) card to provide a data communication connection to a compatible LAN. Wireless links may also be implemented. In any such implementation, the communication interface sends and receives electrical, electromagnetic, or optical signals that carry digital data streams representing various type of information. The network link typically provides data communication through one or more networks to other data devices.

For example, the network link may provide a connection through the local network to the host computer or to data equipment operated by an Internet Service Provider (ISP). The ISP in turn provides data communication services through the worldwide packet data communication network, now commonly referred to as the "Internet." The local network and the Internet both use electrical, electromagnetic, or optical signals that carry digital data streams. The signals through the various networks and the signals on the network link and through the communication interface, which carry the digital data to and from the controller 50, are exemplary forms of carrier waves transporting the information. The controller 50 can send messages and receive data, including program codes, through the network(s), the network link, and the communication interface. In the Internet example, a server might transmit a requested code for an application program through The Internet, the ISP, the local network, and the communication interface. In accordance with one aspect of the invention, one such downloaded application may provide a digital volume level control system for implementing functionality of the volume level meter 5 as described herein. The received code may be executed by the processor as it is received, and/or stored in the storage device, or other non-volatile storage for later execution. In this manner, in some embodiment, the controller 50 may obtain an application code in the form of a carrier wave.

The controller 50 can be configured or programmed to control the volume level display 15 to display one or more indicators 34 of the volume level, which are displayed to the vocalist 22. Indicators 34 can be various types of visual cues to communicate a volume level of the audio signal to the vocalist 22. The embodiment of the volume level meter 5 depicted in the figures provides indicators 34 using a plurality of lights 81-96 arranged in two rows 46, 48 on the front side 36 of the housing 30. One or more of the lights 81-96 in one or both rows 46, 48 can be activated as an indicator 34. Other arrangements are also possible depending on the configuration of the indicators 34, such as in embodiments in which one or more of the indicators is provided using a display or touchscreen.

In the embodiment of the figures, the controller 50 is coupled to lights 81-96 via four leads 71-74. Use of four leads to control each of sixteen lights 81-84 permits the volume level meter 5 to have a housing 30 with a thickness that is compatible with conventional pop filter implementations and microphone shock mount interfaces. The controller 50 is configured to control the lights 81-96 using control signals provided to the LEDs. A first lead controls a first light in a first row of the two rows and a second light in a second row of the two rows, wherein a second lead controls a third light in the first row and a fourth light in the second row, wherein a third lead controls a fifth light in the first row and a sixth light in the second row, and wherein a fourth lead controls a seventh light in the first row and an eighth light in the second row. For example, in the illustrated embodiment, leads 71 and 72 are coupled to provide control signals to lights 81-84; leads 72 and 73 are coupled to provide control signals to lights 85-88; leads 71 and 74 are coupled to provide control signals to lights 89-92; and leads 73 and 74 are coupled to provide control signals to lights 93-96.

The plurality of lights 81-96 shown in the figures are light emitting diodes (LEDs) although other types of lights can be used as indicators 34. The lights 81-96 are depicted as being essentially clear or "white" in color, although in some embodiments, one or more of the lights 81-96 can have various colors or appearances to allow a vocalist 22 to better differentiate between volume levels when looking at the volume level display 15.

The embodiment of the volume level meter 5 shown in the figures has two rows of lights 46, 48 which are positioned symmetrically on the housing 30. The housing 30 is a circular pop filter frame, although other pop filter shapes and characteristics may be possible. The rows 46, 48 are depicted as being symmetrical arcs generally following an arc on either side of the circular pop filter frame 30, although each row 46, 48 can have other characteristics in other embodiments. For example, rows 46, 48 may be essentially straight lines, or may be physically separated or colored according to a coloring scheme to indicate thresholds associated with various volume levels of the audio signal.

As an example of use of indicators 34 by the volume level meter 5 in order to indicate a range of volume levels to the vocalist 22, one or more of the indicators 34 can be associated with respective volume levels of the audio signal. The controller 50 can determine an appropriate indicator 34 to display based on the volume level of the audio signal. For example, if the controller 50 determines that the volume level exceeds a first threshold associated with a first range of volume levels, the controller 50 may provide a first indicator to the vocalist 22 by controlling the volume level display 15. In an embodiment, the first indicator may be at least illumination of lights 81 and 82. If the controller 50 determines that the volume level exceeds a second threshold that is higher than the first threshold and is associated with a second range of volume levels (e.g., a threshold that is higher than the first threshold), the controller 50 may provide a second indicator to the vocalist 22 by controlling the volume level display 15. The second indicator may be at least illumination of lights 81, 82, 83 and 84. The controller 50 can monitor audio signals and compare the signals against various volume level thresholds, then control the volume level display 15 to provide one or more indicators 34 based on the volume levels of the audio signals.

C. Conclusions

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

The foregoing description illustrates and describes the processes, machines, manufactures, compositions of matter, and other teachings of the present disclosure. Additionally, the disclosure shows and describes only certain embodiments of the processes, machines, manufactures, compositions of matter, and other teachings disclosed, but, as mentioned above, it is to be understood that the teachings of the present disclosure are capable of use in various other combinations, modifications, and environments and is capable of changes or modifications within the scope of the teachings as expressed herein, commensurate with the skill and/or knowledge of a person having ordinary skill in the relevant art. The embodiments described hereinabove are further intended to explain certain best modes known of practicing the processes, machines, manufactures, compositions of matter, and other teachings of the present disclosure and to enable others skilled in the art to utilize the teachings of the present disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational queues. These headings shall not limit or characterize the invention(s) set forth herein.

What is claimed is:

1. A volume level meter for a microphone, the meter comprising:
   means for receiving audio signals from the microphone, said signals having a volume level;
   means for visually displaying an indicator of the volume level at which distortion of the audio signals occurs within the field of view of a vocalist while the audio signals are being recorded, wherein the means for visually displaying is positioned on a pop filter mounted between the vocalist and the microphone and comprising a housing, wherein the means for visually displaying is positioned on a side of the housing facing the vocalist, wherein the indicator comprises activation of at least one light of a plurality of lights of the means for visually displaying, and wherein the at least one light is a light-emitting diode (LED); and
   a display controller coupled to the microphone and the means for visually displaying, wherein the display controller is configured to receive an amplified audio signal from the microphone that is indicative of the sound volume level, wherein the display controller is disposed within the housing, wherein the display controller is configured to control the means for visually displaying to indicate the sound volume level at which distortion of the audio signals occurs.

2. A volume level meter for a microphone, the meter comprising:
   a housing mounted on the microphone;
   a connection to receive signals from the microphone and provide the signals for recording, said signals having a volume level;
   a volume level display arranged on the housing so as to indicate the volume level at which distortion of the audio occurs while the signals are being recorded, wherein the volume level display is positioned on a pop filter that is mounted between the vocalist and the microphone, wherein the pop filter comprises a housing, and the volume level display is positioned on a side of the housing facing the vocalist, wherein the indicator comprises the activation of at least one light of a plurality of lights of the volume level display, and wherein the at least one light is a light-emitting diode (LED);
   an amplifier to modulate the signals to an amperage sufficient to drive the volume level display; and
   a display controller coupled to the microphone and the volume level display, wherein the display controller is configured to receive an amplified audio signal from the microphone that is indicative of the sound volume level, wherein the display controller is disposed within the housing, wherein the display controller is configured to control the volume level display to indicate the sound volume level at which distortion of the audio signals occurs.

3. The volume level meter of claim 2, wherein the housing is a pop filter frame.

4. The volume level meter of claim 3, wherein the volume level display comprises plurality of lights positioned in two rows on the pop filter frame.

5. The volume level meter of claim 2, wherein the housing is a circular pop filter frame.

6. The volume level meter of claim 4, wherein the plurality of lights are positioned along two arcs symmetrically positioned on the circular pop filter frame.

7. A vocal volume metering system, comprising:
   a microphone to provide signals for recording;
   a volume level display positioned adjacent to the microphone and configured to provide an indicator visible to a vocalist of a sound volume level received by the microphone, wherein the indicator is provided while the signals are being recorded, wherein the volume level display is positioned on a pop filter that is mounted between the vocalist and the microphone, wherein the pop filter comprises a housing, wherein the volume level display is positioned on a side of the housing facing the vocalist, wherein the indicator comprises the activation of at least one light of a plurality of lights of the volume level display, and wherein the at least one light is a light-emitting diode (LED); and
   a display controller coupled to the microphone and the volume level display, wherein the display controller is configured to receive an amplified audio signal from the microphone that is indicative of the sound volume level, wherein the display controller is disposed within the housing, wherein the display controller is configured to control the volume level display to indicate the sound volume level at which distortion of the audio signals occurs.

8. The system of claim 7, wherein the housing comprises a power interface configured to receive phantom power and a microphone interface configured to receive the amplified audio signal.

9. The system of claim 8, wherein one or both of the volume level display and the display controller is powered by the phantom power.

10. The system of claim 7, wherein the housing comprises a gain control interface configured to adjust a gain of the microphone and a display control interface configured to adjust the brightness of one or more indicators provided by the volume level display.

11. The system of claim 7, wherein the first indicator comprises the activation of one light in each of two rows of lights of the volume level display.

12. The system of claim 11, wherein the display controller is configured to control the volume level display to provide a first indicator if the sound volume level exceeds a first threshold; wherein the display controller is configured to control the volume level display to provide a second indicator if the sound volume level exceeds a second threshold; wherein the second threshold is greater than the first threshold; and wherein the second indicator comprises the activation of two lights in each of the two rows of lights.

13. The system of claim 12, wherein the volume level display is coupled to the display controller via four leads, wherein a first lead controls a first light in a first row of the two rows and a second light in a second row of the two rows, wherein a second lead controls a third light in the first row and a fourth light in the second row, wherein a third lead controls a fifth light in the first row and a sixth light in the second row, and wherein a fourth lead controls a seventh light in the first row and an eighth light in the second row.

14. The system of claim 7, wherein the display controller is configured to couple to the microphone wirelessly.

15. The system of claim 7, further comprising a splitter coupled to the microphone and configured to split the amplified audio signal into two or more split amplified audio signals, wherein a first split amplified audio signal is provided to the display controller and a second split amplified audio signal is provided to a mixer.

* * * * *